United States Patent
Bachman et al.

(10) Patent No.: US 6,960,836 B2
(45) Date of Patent: Nov. 1, 2005

(54) REINFORCED BOND PAD

(75) Inventors: Mark Adam Bachman, Sinking Spring, PA (US); Daniel Patrick Chesire, Orlando, FL (US); Sailesh Mansinh Merchant, Breinigsville, PA (US); John William Osenbach, Kutztown, PA (US); Kurt George Steiner, Fogelsville, PA (US)

(73) Assignee: Agere Systems, Inc., Allentown, PA (US)

( * ) Notice: Subject to any disclaimer, the term of this patent is extended or adjusted under 35 U.S.C. 154(b) by 12 days.

(21) Appl. No.: 10/675,260

(22) Filed: Sep. 30, 2003

(65) Prior Publication Data

US 2005/0067709 A1 Mar. 31, 2005

(51) Int. Cl.[7] .............................................. H01L 23/52
(52) U.S. Cl. ....................... 257/763; 257/763; 257/761; 257/764

(58) Field of Search ................................. 257/763, 761, 257/762, 750, 764, 765, 766, 770

(56) References Cited

U.S. PATENT DOCUMENTS

| 5,284,797 A | * | 2/1994 | Heim | 438/612 |
|---|---|---|---|---|
| 6,143,396 A | * | 11/2000 | Saran et al. | 428/162 |
| 6,187,680 B1 | * | 2/2001 | Costrini et al. | 438/688 |
| 6,803,302 B2 | * | 10/2004 | Pozder et al. | 438/612 |
| 2002/0000671 A1 | | 1/2002 | Zuniga et al. | |
| 2002/0187634 A1 | | 12/2002 | Saran et al. | |
| 2003/0045088 A1 | | 3/2003 | Imai et al. | |
| 2003/0178644 A1 | | 9/2003 | Lee et al. | |

* cited by examiner

*Primary Examiner*—David Nelms
*Assistant Examiner*—Thinh T Nguyen

(57) ABSTRACT

Disclosed herein is a reinforcing system and method for reinforcing a contact pad of an integrated circuit. Specifically exemplified is a system and method that comprises a reinforcing structure interposed between a top contact pad layer and an underlying metal layer.

6 Claims, 2 Drawing Sheets

REINFORCED BOND PAD

FIELD OF THE INVENTION

The invention is related in general to the field of semiconductor devices and processes. More particularly, the invention is related to a system and method for reinforcing a bond pad.

BACKGROUND OF THE INVENTION

A well-known problem area in semiconductor processing is the process of attaching a solder, wire or other bonding elements to a bond pad on a semiconductor integrated circuit. These bond pads are typically disposed above one or more layers or stacks of brittle and/or soft dielectric materials, typically oxide of silicon and some organic materials, for planarization and insulation purposes. Some dielectric materials, such as hydrogen silsesquioxane (HSQ), aerogels, organic polyimides, and parylenes are advantageous for their low dielectric constants compared to silicon oxides, but are weaker structurally and mechanically.

During the bonding process, mechanical loading and ultrasonic stresses applied by the bonding capillary tip to the bond pad often result in fracture of the underlying dielectrics, deformation of the underlying metal structures, and delamination of the layers in the metal structures. These bonding failures may appear as craters in the bond pad and underlying layers as the bonding capillary tip is pulled away from the bonding pad. However, these defects often are not apparent during bonding but would manifest themselves during subsequent bond pull and shear tests, reliability tests such as thermal cycle or thermal shock, or upon de-processing and cross-sectioning.

Further, weakness of the bond pad structure may also reveal itself during wafer probing prior to bonding. Again, the stresses exerted by the probe tips, typically formed of a hard metal such as tungsten, can cause localized fractures in the pads, despite the fact that they make contact with a soft metal, aluminum, on the bond pads. Such fractures are as much of a reliability hazard as those caused during bonding. This compounded with wire bonding and package assembly can lead to further reliability hazards.

Traditionally, the bonding failures have been addressed by altering bonding parameters, such as ultrasonic power and pulse waveform, bonding temperature, bonding time, clamping force, shape of the bonding capillary tip, etc. Much time is spent experimenting with parameter settings and combinations thereof. Although general guidelines of parameter set points and configurations have been developed, the bonding failures persist at a sufficiently significant level to continually threaten the reliability of integrated circuit devices. Yet the failure levels are low such that bonding failures become apparent only after several tens of thousands of devices are bonded.

Recent technological advances in semiconductor processing do not alleviate the situation. New dielectric materials with lower dielectric constants are being used to increase circuit speeds but they are mechanically weaker than the conventional plasma enhanced chemical vapor deposition (CVD) dielectrics. Decreasing bond pad dimensions necessitates the increase of vertical bonding force or forces attributable to the use of ultrasonic energy to form effective bonds. Inaccessibility of higher bond parameter settings for fear of damage to the bond pads also results in longer bond formation time, and consequently, lost throughput. All these significant changes point to a trend of more severe failures and increase in their frequency.

BRIEF SUMMARY OF THE INVENTION

Accordingly, there is a need for a reliable way to prevent or minimize the occurrence of probe and bonding failures where bond pads are situated above one or more structurally and mechanically weak dielectric layers.

In accordance with the present invention, a bond pad reinforcing system and method are provided which eliminate or substantially reduce the disadvantages associated with prior apparatus and methods.

In one aspect of the invention, the reinforcing system for a bond pad according to the teachings of the present invention includes a reinforcing patterned structure disposed between the top contact pad metal layer and an underlying metal layer. The terms "bond pad" and "contact pad" are used interchangeably herein.

In another aspect of the invention, the reinforcing system for a bond pad according to the teachings of the present invention includes a top metal contact pad layer, at least one underlying metal layer, and at least one dielectric layer or a stack of multiple dielectric layers disposed under the contact pad. A reinforcing patterned structure is disposed in at least one dielectric stack.

In yet another aspect of the invention, a method for reinforcing a bond pad in a semiconductor integrated circuit includes the steps of forming a metal layer, patterning the metal layer in a predetermined area into a predetermined pattern having a plurality of vacant areas, and forming a metal layer above the patterned metal layer, filling the vacant areas in the patterned metal layer.

In one aspect of the invention, the reinforcing patterned structure may be a joined or interconnected structure. In another aspect of the invention, the reinforcing patterned structure may comprise disjoined or non-interconnected and repeating elements. A technical advantage of the present invention is the improved structural integrity of bond pads so that forces exerted during bonding do not damage the bond pad and underlying structures. These technical advantages are possible without changing bonding parameters, which may decrease process throughput. The result is a more reliable integrated circuit and decreasing bonding failures.

The foregoing has outlined some of the more pertinent objectives of the present invention. These objectives should be construed to be merely illustrative of some of the more prominent features and applications of the invention. Many other beneficial results can be attained by applying the disclosed invention in a different manner of modifying the invention as will be described.

It is to be understood that the foregoing general description and the following detailed description are exemplary and explanatory only and are not to be viewed as being restrictive of the present, as claimed. These and other aspects, features and advantages of the present invention will become apparent after a review of the following description of the preferred embodiments and the appended claims.

DESCRIPTION OF PREFERRED EMBODIMENTS

Figure 1:
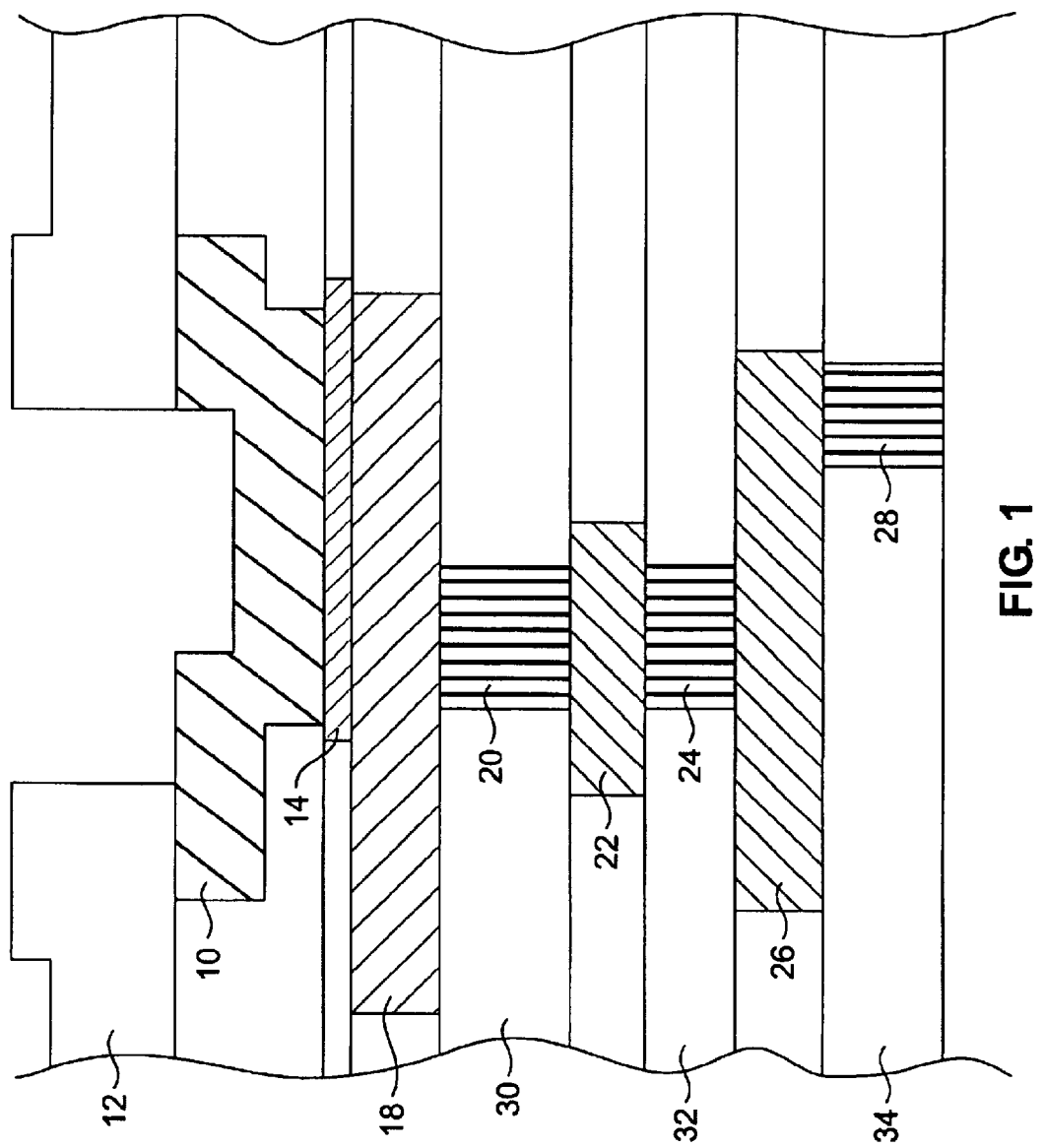
FIG. 1 represents a cross-section of a preferred embodiment of the invention showing the reinforcing layer.

FIGS. 1–2 illustrate preferred embodiments of the subject invention. FIG. 1 depicts a cross section of a preferred embodiment showing a contact pad layer 10 for attaching to a package substrate (not shown) through conventional bonding techniques, such as, but not limited to, wire bonding, flip-chip bonding and tape-automated bonding. Preferably, a ball bond (not shown) typically made of aluminum, gold, copper, solder, or like materials is bonded to the contact pad 10. The contact pad is exposed and uncovered from a protective oxide layer 12. The contact pad layer is made of a conductive material, preferably metal, and preferably still, comprised of aluminum and/or copper. Immediately underlying the contact pad layer 10 is a reinforcement layer 14. The reinforcement layer is made of a strong, "refractory" metal, such as titanium, titanium nitride, tungsten, tungsten nitride, nickel, nickel nitride, tantalum, tantalum nitride, tantalum silcon nitride, and combinations/alloys thereof. Underlying the reinforcement layer 14 is first metal layer 18 made of aluminum or copper or combinations/alloys thereof. Under the first metal layer 18 is a first dielectric layer 30, and a first via 20 which conductively connects the first metal layer 18 and a second metal layer 22. Underlying the second metal layer 22 is a second dielectric layer 32 and a second via 24 which conductively connects the second metal layer 20 to a third metal layer 26. Underlying the third metal layer 26 is a third dielectric layer and a third via 28.

The metal layers 18, 22 and 26 may be fabricated using processes known to those skilled in the art. For example, damascene processes may be used to fabricate the metal layers when copper is used as the conductive metal. Alternatively, a subtractive etch process is typically used to fabricate aluminum metal layers. The non-conductive material may include dielectrics such as silicon dioxide, silicon nitride or other nonconductive materials such as HSQ, polyamides, polysilicides or PCBs.

Commonly used techniques for depositing the dielectric layers include chemical vapor deposition, sputtering, or spin-on processes. Preferred materials include silicon dioxide, silicon nitride, oxy-nitride, fluoro-silicate glass (FSG), undoped silicate glass (USG), phospor-silicate glass (PSG), plasma-generated tetraethylortho-silicate oxide (TEOS, and recently silicon-containing hydrogen silsequioxane (HSQ), or even gels or a foamy substance, or an organic polymeric such as polyimide and parylene. Each material has its preferred regime for application, as is known in the art. See, e.g., U.S. Pat. No. 6,232,662.

Figure 2A:
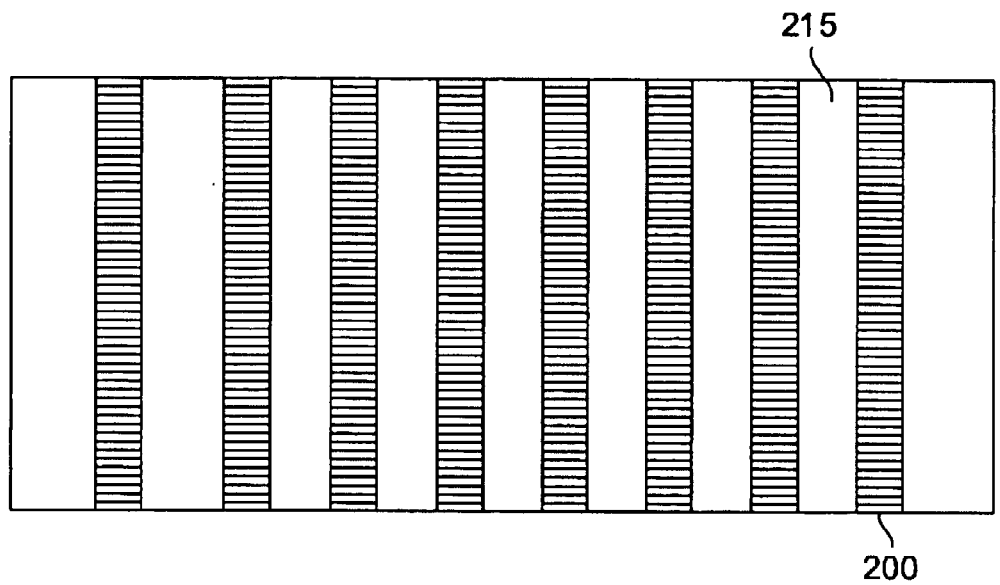
FIG. 2a represents a top planar view of a preferred embodiment of a reinforcing layer that comprises a repeated pattern structure.
Figure 2B:
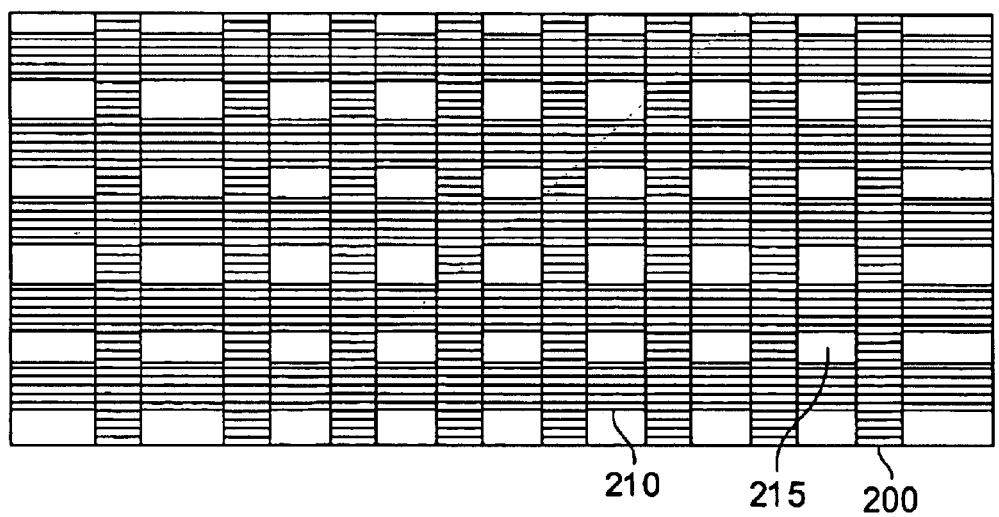
FIG. 2b represents a top planar view of a preferred embodiment of a reinforcing layer that comprises an interconnected grid structure.

In FIG. 2A one embodiment of the reinforcement layer is shown in top plan view. The reinforcement layer is provided as a series of parallel strips 200. In FIG. 2B, the reinforcement layer is provided as a grid of interconnecting metal strips 200 and 210. The void areas 215 between the strips 200 and 210 provide an area to be filled with metal from either the underlying first metal layer 18 or the top contact pad metal layer 10. This allows for both reinforcement of the contact pad 10 to protect the underlying dielectric layers, while not diminishing the conductive communication of the metal layers.

The reinforcement layer is 100 to 500 nm in width. Those skilled in the art will appreciate that certain metals may require a threshold thickness to be effective. For example when using Ni, the thickness of the reinforcement layer should be at least about 200 nm.

It may be seen from above that the reinforcing structure may take on a variety of patterns. In general, the pattern may be regular and repeating, such as the grid, crucifix, honeycomb, and nested configurations. The pattern may also have connected or unconnected reinforcing elements. Non-repeating patterns may also be used. The reinforcing structure pattern preferably occupies the entire or a substantial area under the bond pad and allows the weak dielectric material to fill the vacant areas between the reinforcing lines of the reinforcing structure. Further, the composition of reinforcing structure may be the same as the metalization in the corresponding metal layers. For example, the reinforcing structure may have a titanium nitride/titanium nitride/titanium bottom layer, an aluminum middle layer, and a titanium nitride top layer. Reinforcing structure may also be constructed of other conductive or semiconductive materials.

It may be understood that the reinforcing structure of the instant invention is applicable to strengthen any bond pad with underlying weak dielectric layers so that it may withstand stresses and forces imparted during any wire, solder, or other bonding processes, such as flip-chip bonding, ultrasonic bonding, thermosonic bonding, thermocompression bonding, solder bump or said bump bondings, and pre-bonding wafer probe operation.

Accordingly, the teachings of the present invention includes any structure constructed substantially within the bond pad that mechanically reinforces the underlying brittle and/or soft dielectric structures. It is particularly advantageous when the reinforcing structure is comprised of an existing layer that already goes through patterning, such as the interconnecting metal lines.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A wire bonding pad reinforcing system for an integrated circuit of the type using brittle inter-level dielectrics comprising:
    a wire bonding pad formed of a metal;
    a metal reinforcing layer formed under and in contact with the wire bonding pad, the metal reinforcing layer being structured to stiffen the wire bonding pad and to distribute bonding forces over an extended area;
    at least one metal layer disposed under and in contact with said reinforcing layer; and
    at least one brittle inter-level dielectric extending within the integrated circuit below said at least one metal layer.

2. The reinforcing system of claim 1 wherein the metal of the reinforcing layer is a refractory metal.

3. The reinforcing system of claim 1 wherein said reinforcing layer is a patterned structure.

4. The reinforcing system of claim 1 wherein the metal of the contact pad is selected from the group comprising aluminum, copper and alloys of aluminum and copper.

5. The reinforcing system of claim 1 wherein the metal of the reinforcing layer is selected from the group comprising titanium, titanium nitride, tungsten, tungsten nitride, nickle, and alloys or combinations thereof.

6. The reinforcing system of claim 1, wherein said reinforcing layer is 100–600 nm thick.

* * * * *